(12) United States Patent
Norström et al.

(10) Patent No.: US 7,217,609 B2
(45) Date of Patent: May 15, 2007

(54) SEMICONDUCTOR FABRICATION PROCESS, LATERAL PNP TRANSISTOR, AND INTEGRATED CIRCUIT

(75) Inventors: Hans Norström, Solna (SE); Ted Johansson, Djursholm (SE)

(73) Assignee: Infineon Technologies AG, Munich (DE)

( * ) Notice: Subject to any disclaimer, the term of this patent is extended or adjusted under 35 U.S.C. 154(b) by 355 days.

(21) Appl. No.: 10/918,057

(22) Filed: Aug. 13, 2004

(65) Prior Publication Data
US 2005/0035412 A1    Feb. 17, 2005

Related U.S. Application Data

(63) Continuation of application No. PCT/SE03/00221, filed on Feb. 11, 2003.

(30) Foreign Application Priority Data
Feb. 13, 2002    (SE) .................................... 0200414

(51) Int. Cl.
*H01L 21/8238*    (2006.01)
(52) U.S. Cl. .................... 438/204; 438/316; 438/327; 438/335; 438/368
(58) Field of Classification Search .................... None
See application file for complete search history.

(56) References Cited

U.S. PATENT DOCUMENTS

| | | | | |
|---|---|---|---|---|
| 5,079,602 A | * | 1/1992 | Harada | 257/341 |
| 5,091,760 A | * | 2/1992 | Maeda et al. | 257/370 |
| 5,326,710 A | | 7/1994 | Joyce et al. | 437/31 |
| 5,838,048 A | * | 11/1998 | Hirai et al. | 257/378 |
| 5,953,600 A | | 9/1999 | Gris | 438/200 |
| 6,440,787 B1 | * | 8/2002 | Yoshihisa | 438/202 |

FOREIGN PATENT DOCUMENTS

| | | |
|---|---|---|
| EP | 0 093 086 | 4/1983 |
| EP | 0 084 465 A2 | 7/1983 |
| EP | 0 872 893 A1 | 10/1998 |

OTHER PUBLICATIONS

M.C. Wilson, et al.; "Process HJ: A 30 GHz NPN and 20 GHz PNP Complementary Bipolar Process for High Linearity RF Circuits"; Proc.. IEEE BCTM Conf.; p. 164.

\* cited by examiner

*Primary Examiner*—Zandra V. Smith
*Assistant Examiner*—Khanh Duong
(74) *Attorney, Agent, or Firm*—Baker Botts L.L.P.

(57) ABSTRACT

A method in the fabrication of an integrated bipolar circuit comprises the steps of: providing a p-type substrate; forming in the substrate a buried n+-type region and an n-type region above the buried n$^+$-type region; forming field isolation areas around the n-type region; forming a PMOS gate region on the n-type region; forming a diffused n$^+$-type contact from the upper surface of the substrate to the buried n$^+$-type region; the contact being separated from the n-type region; forming a p-type polysilicon source on the n-type region; forming a p-type source in the n-type region; forming a p-type drain in the n-type region; and connecting the PMOS transistor structure to operate as a PNP transistor, wherein the source is connected to the gate and constitutes an emitter of the PNP transistor; the drain constitutes a collector of the PNP transistor; and the n-type region constitutes a base of the PNP transistor.

14 Claims, 13 Drawing Sheets

SEMICONDUCTOR FABRICATION PROCESS, LATERAL PNP TRANSISTOR, AND INTEGRATED CIRCUIT

CROSS REFERENCE TO RELATED APPLICATION

This application is a continuation of copending International Application No. PCT/SE03/00221 filed Feb. 11, 2003 which designates the United States, and claims priority to Swedish application no. 0200414-1 filed Feb. 13, 2002.

TECHNICAL FIELD OF THE INVENTION

The present invention generally relates to the field of silicon IC-technology, and more specifically the invention relates to a fabrication method of a lateral PNP transistor in a semiconductor process flow, especially designed for bipolar RF-IC:s, to a lateral PNP transistor, and to an integrated circuit including the transistor.

DESCRIPTION OF RELATED ART AND BACKGROUND OF THE INVENTION

Advanced silicon bipolar, CMOS or BiCMOS circuits are used today for high-speed applications in the 1–5 GHz frequency range, replacing circuits previously only possible to realize using III–V based technologies.

A common trend in microelectronics is to integrate more and more functions on a single chip, in order to increase the general performance and to reduce size, power consumption and price of the circuits. The versatility of a BiCMOS process is many time preferred, although it is not suited for all applications. High-performance bipolar integrated circuits have been used extensively for some critical building blocks in telecommunication circuits, mainly for analog functions such as switching currents and voltages, and for high-frequency radio circuit functions such as those in mixers, amplifiers, and detectors. For high-performance cost-effective circuits that would be used in e.g. cellular telephones, a bipolar-only process is many times still to prefer, instead of a BiCMOS process.

All modern high-frequency bipolar transistors apply polysilicon emitter technology. The emitter is formed by depositing a polysilicon layer, which is then heavily doped. When activated, preferably using RTA (rapid thermal anneal), the dopants are driven into the underlying substrate. A very thin emitter depth, which also permits thin bases (translates into good high frequency properties) is achieved. Another feature of polysilicon emitter technology is the increased beta, which is strongly related to the details of the interface between the polysilicon layer and the substrate.

Although in most RF-IC design the n-type devices, i.e. NPN transistors, are totally dominating, p-type devices, i.e. PNP-transistors, are needed for some circuit functions. However, a bipolar-only RF-IC process usually lacks good PNP-transistors, since the process is commonly designed for optimal vertical NPN transistor performance. High-performance vertical PNP-transistors can be added to the process flow, but to a cost of increased processing complexity and number of mask layers, see e.g. M. C. Wilson et al., "Process HJ: A 30 GHz NPN and 20 GHz PNP Complimentary Bipolar Process for High Linearity RF Circuits", Proc. IEEE BCTM Conf. 1998, p. 164.

Instead, lateral PNP transistors are usually employed as p-type devices, since the requirement can be very relaxed in terms of high-frequency properties, current drive ability, packing density etc.

The lateral PNP transistor is commonly made by placing two p-type diffusions in close proximity to each other in the epi-layer, one of them, the collector, surrounding the other one, the emitter. In most RF-IC processes, the base will consist of the n-well, with the subcollector used as base contact. The collector and emitter regions are separated by field oxide. A typical example of a lateral PNP device in a BiCMOS process is described in U.S. Pat. No. 5,953,600 by Gris.

The basic function of a MOS-gated lateral PNP-transistor is described in EP 0 093 086 by Vittoz, which points out that the gate should be biased so that the inversion in the MOS channel regions is avoided, i.e. the MOS transistor should always be off. U.S. Pat. No. 5,326,710 by Joyce et al. further describes integration of a lateral PNP device in a BiCMOS process using not only a plain MOS transistor, but also an additional nitride in the gate dielectric. EP 0 872 893 by Laurens describes an optimized lateral PNP transistor using MOS devices in a BiCMOS process.

A lateral PNP transistor by using MOS transistors is usually layouted in a circular manner. In the center of the layout is the emitter (source), surrounded by the gate. The MOS gate is connected to the emitter (source), to assure that the channel of the MOS device is always in accumulation.

A primary problem with the lateral PNP devices made by using MOS transistors is the low gain (beta), which typically is lower than 10. Another problem is the comparatively large area occupied by each device. An optimized structure is therefore needed.

SUMMARY OF THE INVENTION

Accordingly, it is an object of the present invention to provide a method in the fabrication of an integrated circuit, particularly an integrated circuit for radio frequency applications, including a lateral PNP transistor based on a PMOS transistor structure, which overcomes the problems associated with the prior art described above.

It is yet a further object of the invention to provide such a method, wherein a minimum of processing steps is added to a pure bipolar process.

It is still a further object of the invention to provide such a method, wherein the lateral PNP transistor can be produced with very thin emitter depth, and high beta.

To this end the present invention comprises a method, which includes the steps of: providing a p-type doped substrate having an upper surface; forming in the substrate a buried $n^+$-type doped region for a PMOS transistor structure; forming in the substrate an n-type doped region above the buried $n^+$-type doped region; forming field isolation areas around, in a horizontal plane, the n-type doped region; forming a PMOS gate region on the n-type doped region; and forming a diffused $n^+$-type doped contact from the upper surface of the substrate to the buried $n^+$-type doped region, the contact being separated from, in a horizontal plane, the n-type doped region.

According to the present invention a p-type doped polysilicon source region is formed on the n-type doped region; and a p-type doped source region is formed in the n-type doped region by means of diffusion from the p-type doped polysilicon source region.

Further, a p-type doped drain region is formed in the n-type doped region, optionally through diffusion from an optional p-type doped polysilicon drain region.

Finally, the PMOS transistor structure is connected to resemble a PNP transistor, wherein the source region is connected to the gate region and constitutes an emitter of the PNP transistor; the drain region constitutes a collector of the PNP transistor; and the n-type doped region constitutes a base of the PNP transistor.

Advantageously, the PNP transistor device is fabricated together with at least one vertical bipolar NPN transistor, wherein several fabrication steps are performed in common.

Further, to reduce the contact resistance for the collector and the base the respective upper surfaces of the drain region and the diffused n⁺-type doped contact may be silicided before metallization. On the other hand to decrease the recombination rate in the emitter, the upper surface of the source region is directly metallized and is thus not silicided.

Further, it is an object of the present invention to provide a lateral PNP transistor in an integrated circuit, particularly an integrated circuit for radio frequency applications, which overcomes the problems mentioned above.

To this end a lateral PNP transistor is provided, which comprises a p-type doped semiconductor substrate having an upper surface; and a PMOS transistor structure including an n-type doped region formed in the semiconductor substrate; a gate region formed on the n-type doped region and p-type doped source and drain regions formed in the n-type doped region; and a buried n⁺-type doped region located underneath the n-type doped region and connected to the surface of the substrate by means of a diffused n⁺-type doped contact.

The PNP transistor device further includes a p-type doped polysilicon source region on top of the source region, wherewith the p-type doped polysilicon source region is connected to the gate region and constitutes an emitter of the PNP transistor device; the drain region constitutes a collector of the PNP transistor device; and the n-type doped region constitutes a base of the PNP transistor device.

Further, the present invention includes an integrated circuit comprising at least one lateral PNP transistor as described above.

Further characteristics of the invention and advantages thereof will be evident from the detailed description of preferred embodiments of the present invention given hereinafter and the accompanying FIGS. 1–17, which are given by way of illustration only, and thus are not limitative of the present invention.

DETAILED DESCRIPTION OF EMBODIMENTS

A process of manufacturing a PMOS-based lateral PNP transistor in a bipolar process, to which only a few process steps are added, is described below. To illustrate the process, a description of simultaneous formation of a vertical bipolar NPN transistor is also included.

Figure 1:
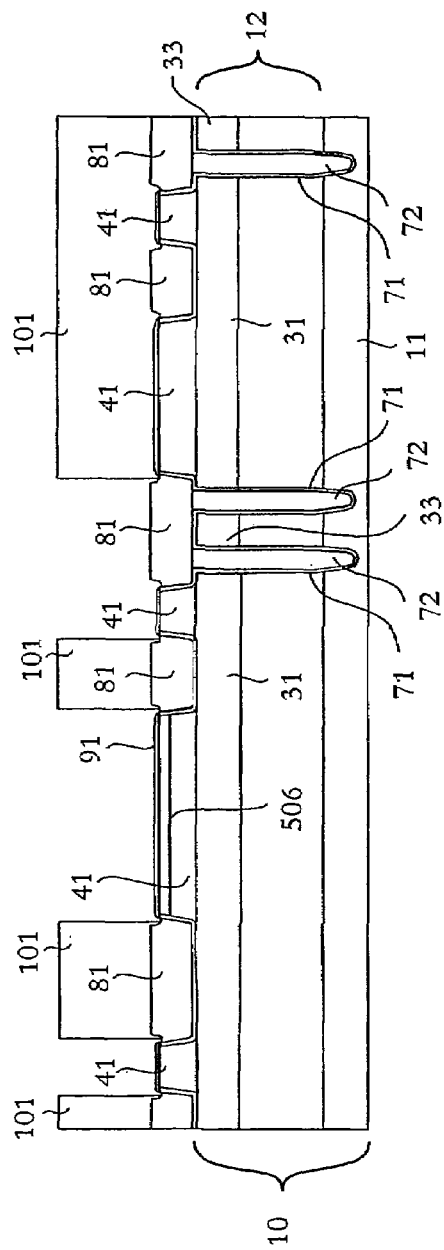
FIGS. 1–9 are enlarged cross-sectional views of a portion of a semiconductor structure during processing according to a preferred embodiment of the present invention.

To reach a structure as the one illustrated in FIG. 1 a starting material 10 consisting of a highly p⁺-doped wafer 11 is provided, on which a low-doped silicon layer 12 of p-type is grown. Alternatively, the p-type wafer can be a homogeneously low-doped p-type wafer (not illustrated).

In the surface layer 12 buried n-doped 31 and p-doped 33 regions are formed by means of (i) forming a thin protective layer of silicon dioxide on the layer 12; (ii) forming a mask thereon by photolithographic methods to define areas for a PMOS structure, and the bipolar transistor, respectively; (iii) n⁺-type doping the areas defined by the mask; (iv) removing the mask; (v) heat treating the structure obtained; (vi) optionally p-type doping in additional areas of the structure; and (vii) exposing the upper surfaces of regions 31 and 33. The regions 31 are also referred to as buried n⁺-type doped subcollectors.

Thereafter, an epitaxial silicon layer 41 is grown on the surface, which layer is doped in selected regions to obtain regions of n- and p-type (n-wells and p-wells). In FIG. 1 all regions 41 are n-type doped.

Alternatively, instead of providing the wafer 11 and forming the epitaxial layers 12 and 41, a single homogenous wafer may be provided, in which the buried regions 31 and 33 are formed by means of ion implantation at high energy and in which n- and optionally p-type doped surface regions 41 are formed by means of ion implantation. The term "substrate" as used herein is intended to mean a wafer, on which optionally a number of epitaxial layers have been grown.

In order to isolate the various regions 41 shallow and optionally deep trenches are formed to surround the respective regions 41.

The shallow trenches are formed by the steps of (i) forming a hard mask by means of oxidizing the silicon surface; depositing a silicon nitride layer; patterning and etching away the silicon nitride and oxide layers at areas where the trenches are to be formed; and (ii) etching the structure. The shallow trenches are reoxidized and filled with a deposited oxide 81 subsequently to deep trench filling, see below.

The shallow trenches can be formed such that they extend vertically from the upper silicon surface, i.e. the upper surface of silicon layer 41, and down to the regions or subcollectors 31, and preferably further down into the subcollectors 31 (not illustrated in FIGS. 1–8). Further, the subcollectors 31 and the shallow trenches can be formed relative each other such that the subcollectors 31 extend into areas located underneath the shallow trenches.

Note that the n-wells 41 may be formed by ion implantation through the above-mentioned silicon nitride and oxide layers and p-wells may be performed at yet a later stage in the process.

The deep trenches are formed by the steps of (i) forming a hard mask for the deep trenches by depositing a silicon dioxide layer; and patterning and etching this silicon dioxide layer to define openings for the deep trenches; (ii) etching the deep trenches; (iii) removing the remaining portions of the oxide hard mask layer; (iv) growing a thin oxide on top of the structure; (v) filling the deep trenches with deposited oxide (the thin grown oxide and the deposited oxide being together denoted by 71) and polysilicon 72; (vi) optionally planarizing the polysilicon; and (vii) etching back to remove all polysilicon from the shallow trench areas.

Subsequently thereto, the shallow trenches are filled with the oxide 81, whereupon the nitride and oxide layers, covering active areas 41, are removed.

Figure 11:
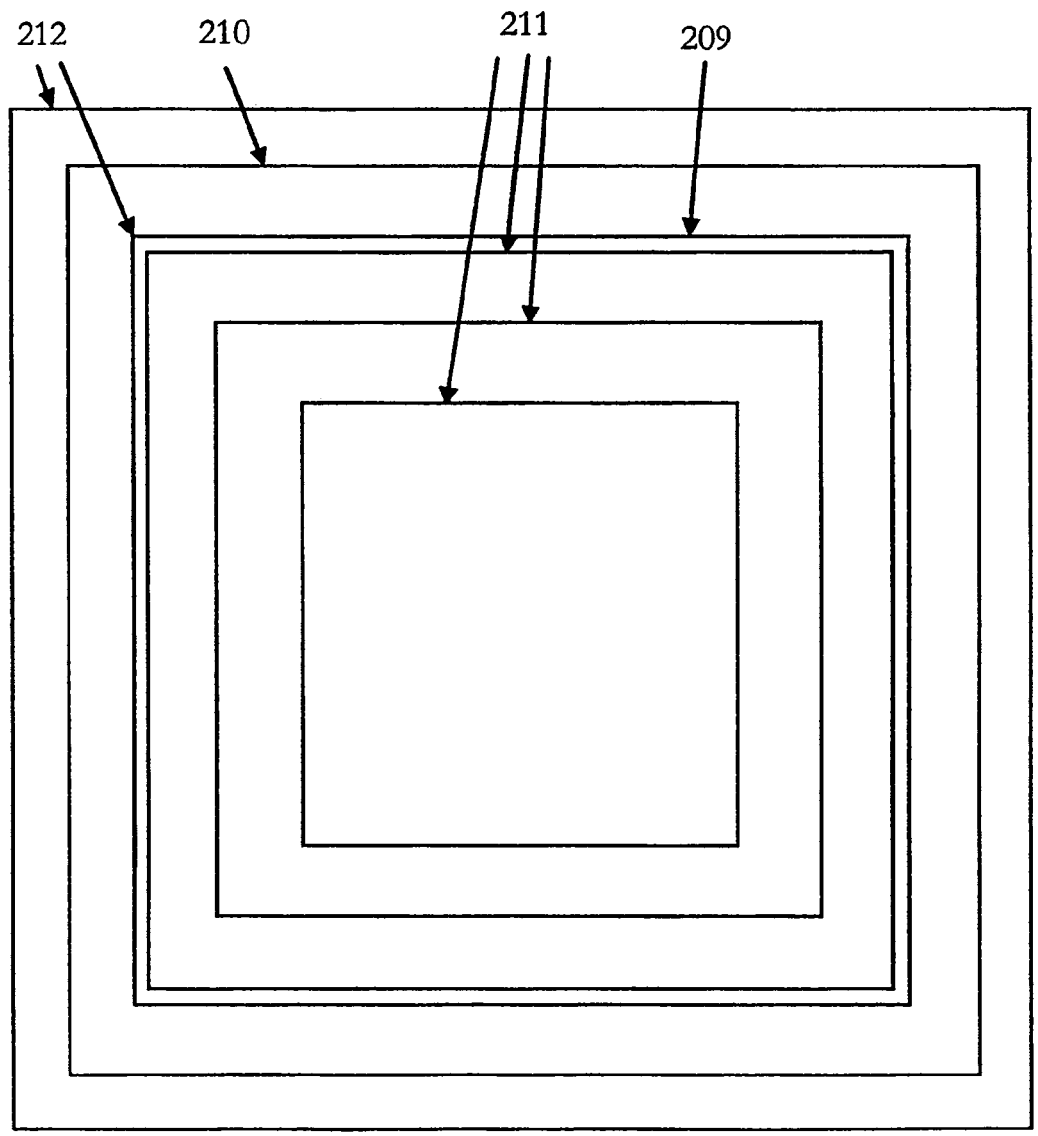
FIGS. 11–17 illustrate preferred layouts of important masks and electrical connections to component areas of a lateral PNP transistor fabricated according to a preferred embodiment of the present invention.

Mask layouts for the subcollector region 31, the n-well 41, the shallow trenches 81 and the deep trenches 71, 72 of the PNP transistor are illustrated in FIG. 11 and are denoted by 209, 210, 211, and 212, respectively. The isolation scheme is further described in the international publication WO 0120664 and in the Swedish patent application No. 0101567-6, both of which being hereby incorporated by reference.

Figure 12:
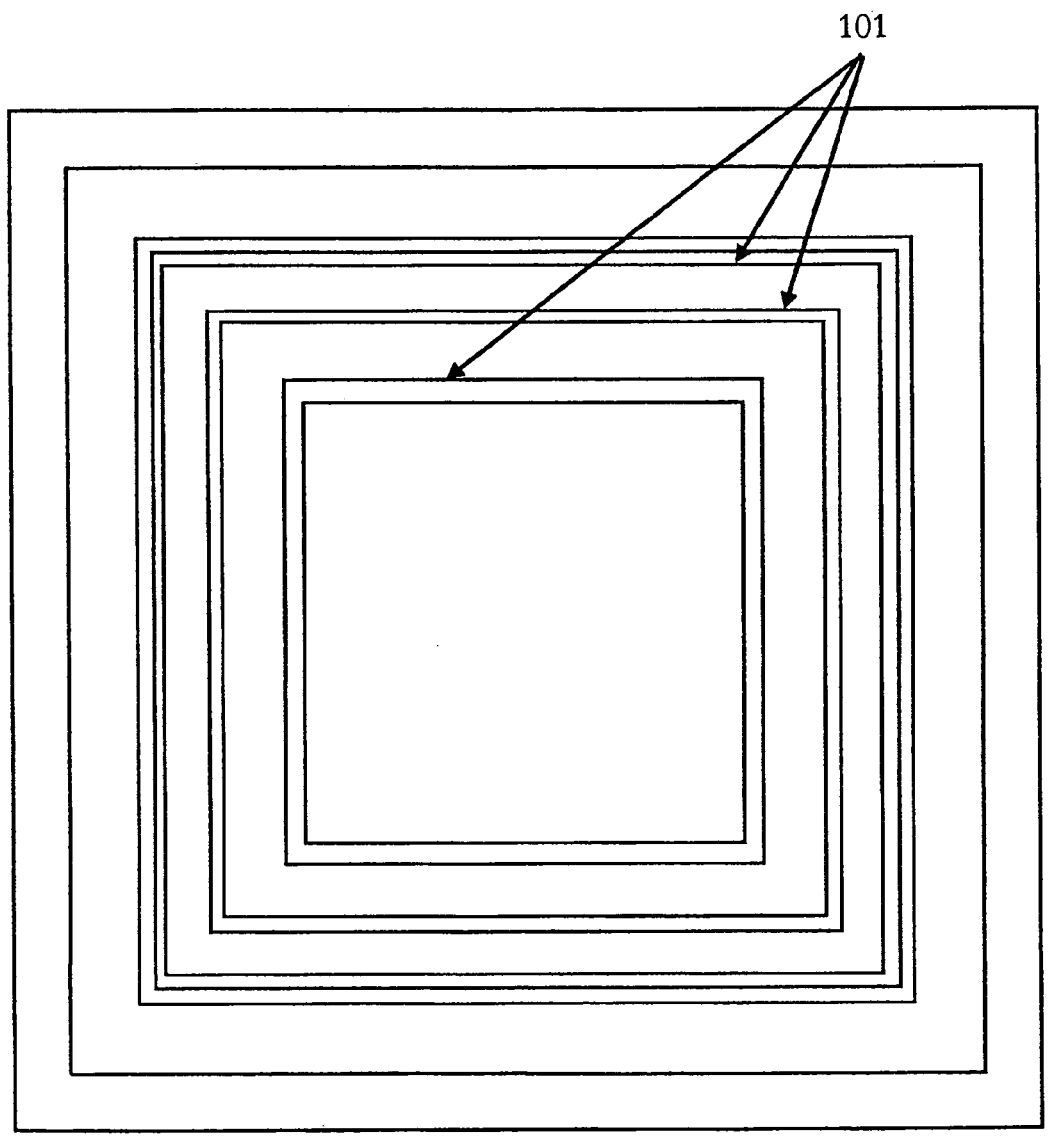

Next, a thin oxide 91 is grown. A photo mask 101 is formed on the structure, which is open on the areas which shall serve as device areas for the PNP transistor, this being a first step added to a pure bipolar process. The layout of the photo mask 101 the PNP transistor is illustrated in FIG. 12.

The wafer is then implanted with a p-type dopant (boron) to form a buried channel or shallow layer 506, see our pending Swedish patent application No. 0103805-8 filed on Nov. 15, 2001 and S. Wolf, "Silicon Processing for the VLSI Era, Volume 2—Process Integration", Lattice Press, Sunset Beach, 1990, pp. 392–397, which documents being hereby incorporated by reference. The resultant structure is shown in FIG. 1.

The energy and dose are preferably selected to obtain suitable channel depth, channel thickness, and doping profile. The dose is further selected to adjust the threshold voltage (VTP) to be in the −0.5 to −1.5 V range. The exact dose, or combination of doses, and elements are dependent on the oxide thickness and the background doping of the substrate under the PMOS gate.

Subsequently, the photo mask 101 is removed.

The oxide 91 is preferably replaced by a gate oxide 111 on top of the structure using oxide etching followed by thermal oxidation. This oxide renewal is due to high MOS requirements, as the quality of the first oxide is normally not sufficient after being subjected to ion implantation. Following directly, an undoped poly-crystalline or non-crystalline silicon layer 112 is deposited on the gate oxide 111. Optionally, the silicon layer 112 is n-type doped by ion implantation, or is in-situ n-type doped while being deposited.

Figure 2:
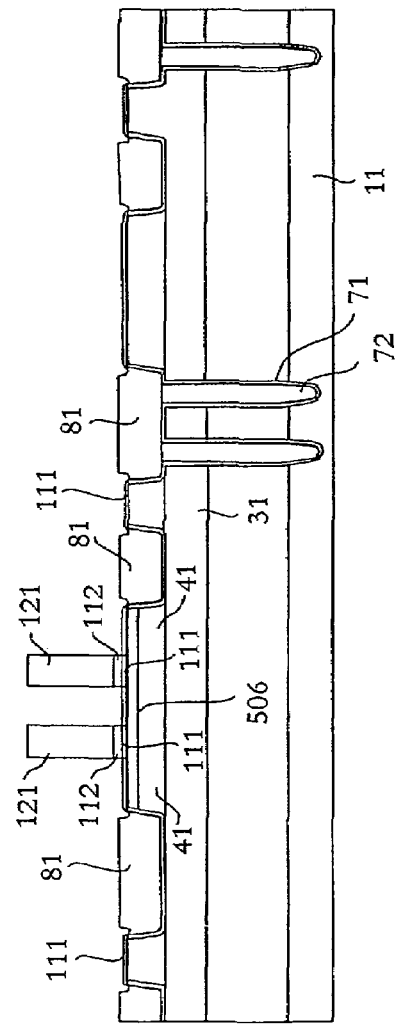
Figure 13:
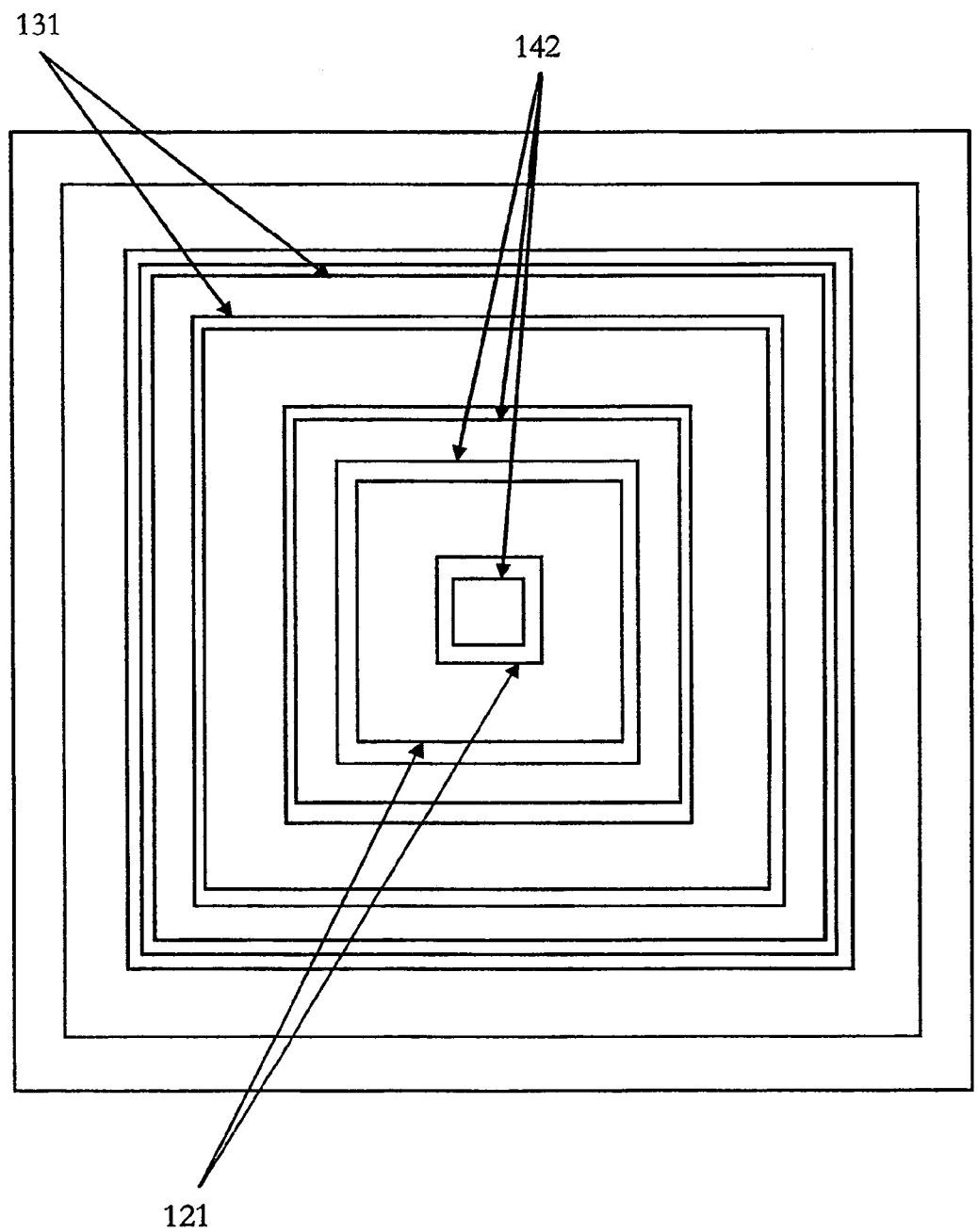

The deposited silicon layer 112 is needed to form a PMOS gate region of PMOS-based lateral PNP transistor and shall be removed from the other areas of the wafer. Thus, a mask 121, the layout of which is shown in FIG. 13, covering the PMOS gate region is applied to the wafer. Using mask 121 silicon is removed by etching, using the field oxide/gate oxide 81/111 as etch stop. The resulting structure is shown in FIG. 2. The photo mask is then removed using conventional methods.

For the formation of active devices, such as transistors, low-resistance paths, i.e. a collector diffused $n^+$-type doped plugs, from the surface of the wafer to the buried $n^+$-type doped layer 31 are needed. The paths are defined lithographically, by applying a mask 131 having open areas 132 and 133 for forming plugs for the bipolar transistor and the PMOS structure, respectively. The layout of mask 131 is illustrated in FIG. 13. Doping of n-type is performed through the open areas 132 and 133. Details of the selection of energy and doses are discussed in WO 9853489, which publication being hereby incorporated by reference.

Figure 3:
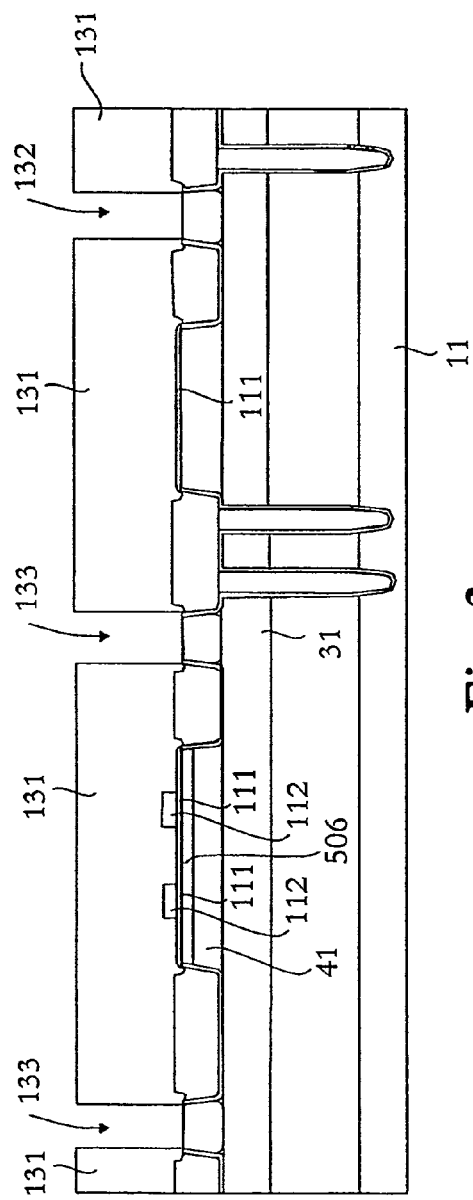

After the implantation, still having the photo mask 131 present on the wafer, the thin protective silicon dioxide layer 111 is removed in the open areas. The resulting structure is shown in FIG. 3. The photo mask 131 is then removed by conventional methods, after which the wafer is optionally given a heat treatment.

Subsequently, a thin silicon nitride layer 141 is deposited, the purpose of which is threefold: (i) to add to the insulator layer deposited in the active area of the bipolar transistor resulting in lower parasitic capacitance for the base-collector junction;
(ii) to encapsulate the gate layer 112 of the PMOS structure during subsequent processing; (iii) to define source and drain areas for the PMOS transistor; and (iv) to serve as an oxidation-resistant mask for the collector plugs 41 (in openings 132 and 133 in FIG. 3) and the gate layer 112 of the PMOS transistor structure. Subsequent to the deposition of nitride layer 141, the wafer is lithographically patterned by depositing a photoresist layer 142 and then opening the resist for the PMOS structure/lateral PNP transistor and the NPN transistor to be formed. The mask 142 has openings 145, 144, 143 for the drain and source regions of the PMOS structure and for the emitter/base region of the NPN transistor. The mask layout for the PMOS structure/lateral PNP transistor is illustrated in FIG. 13.

Figure 4:
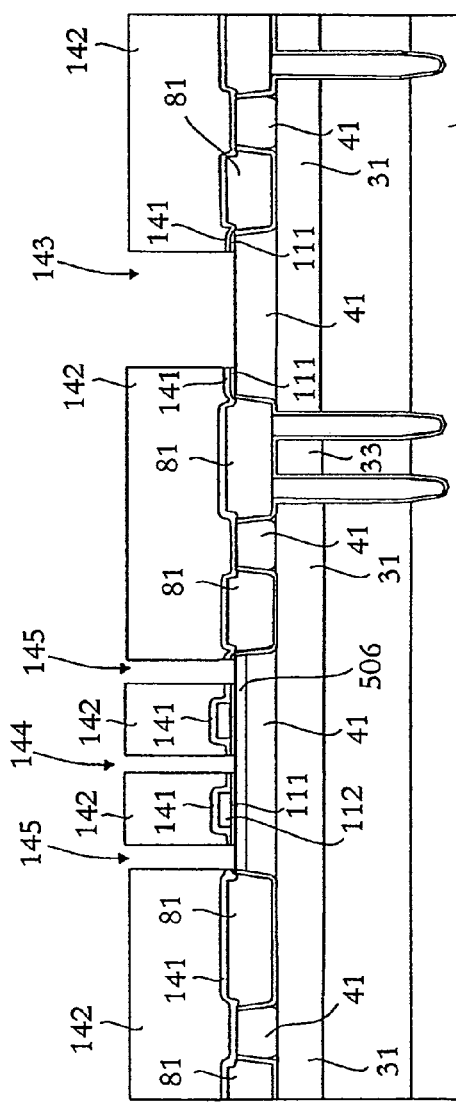

The nitride 141 and oxide 111 layers in the openings are removed by conventional etching, and the resulting structure is shown in FIG. 4. Subsequent to the etching of the nitride 141 and the oxide 111, the photo mask 142 is removed by conventional methods.

A thin silicon layer 151 is next deposited on the structure. The deposition conditions are selected such that the layer 151 will be amorphous, but microcrystalline or polycrystalline silicon can alternatively be used. The purpose of the layer is to serve as base contacts for the NPN-transistor and source and drain contacts for the PMOS/PNP-transistor.

After this deposition, the silicon layer is doped to p-type. The energy is preferably selected such that the implanted boron atoms will not reach through the deposited silicon layer 151. If a non-crystalline silicon layer is employed the control of the implanted doping profile is enhanced.

On top of the silicon layer 151, a low-temperature oxide layer 152 is deposited.

Figure 14:
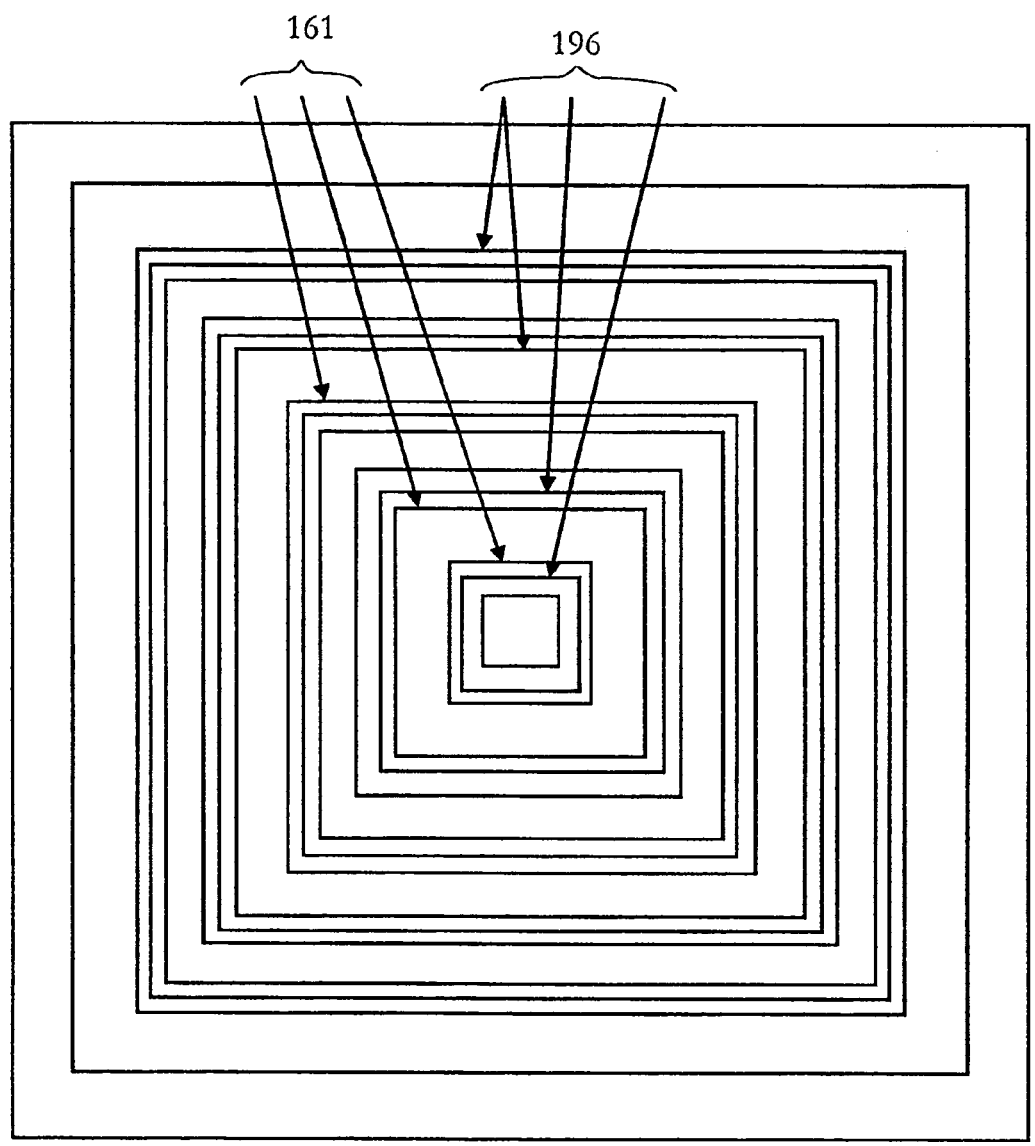

Next, a photo mask 161 is applied to the structure, the layout of which PMOS structure/lateral PNP transistor is illustrated in FIG. 14. The resist protects the areas, which will form drain, source, and base contacts for the transistors. Using the mask 161, the silicon dioxide layer 152 and the silicon layer 151 are removed in open areas using dry etching. The etching is stopped when the silicon nitride layer 141 is completely exposed. The thus formed polysilicon source and drain regions are denoted by 151' and 151".

Figure 5:
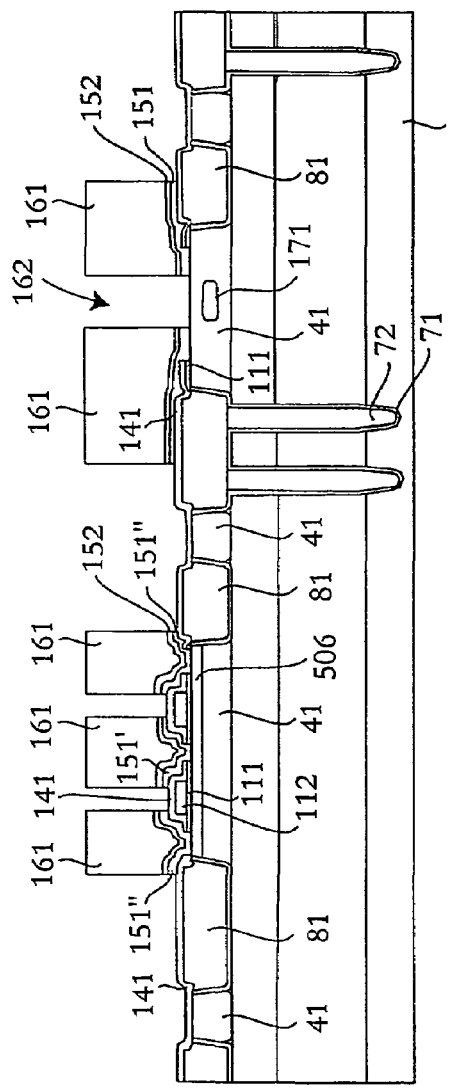

Thereafter, a secondary implanted collector 171 is optionally formed and the resulting structure is shown in FIG. 5. The PMOS gate region 111, 112 is not covered by any photo mask during the implantation and is totally penetrated by the implanted species. The implantation will therefore affect the threshold voltage of the transistor, but can be compensated for by changing the threshold voltage implantation dose described above.

After the implantation, the resist is removed using conventional methods, and a thin silicon dioxide (not illustrated) is thermally grown on the wafer surface where bare silicon is exposed, that is, in the intrinsic base opening 162. As a consequence of the heat applied the boron previously implanted in the layers 151', 151", 151 is redistributed and driven into the substrate to form p-type source 198 and drain 199 regions and base contact paths 173. Also, if the silicon 151 is amorphous, it is converted to polycrystalline silicon.

Subsequently, boron will be implanted into the structure to form the intrinsic base region 174 of the NPN transistor. After the implantation, the structure is further oxidized, preferably in wet atmosphere at 800° C., which reduces the concentration of boron atoms at the silicon/silicon dioxide surface.

Then, a silicon nitride layer is conformally deposited with and etched anisotropically to form sidewall spacers 181 where large steps at the surface exist. Not only the recently deposited nitride is removed, but also the thin nitride 141 present on shallow trench isolation 81 and collector contact areas 41 is simultaneously removed. In the center of the opening 162 the thermal oxide is also removed.

Figure 6:
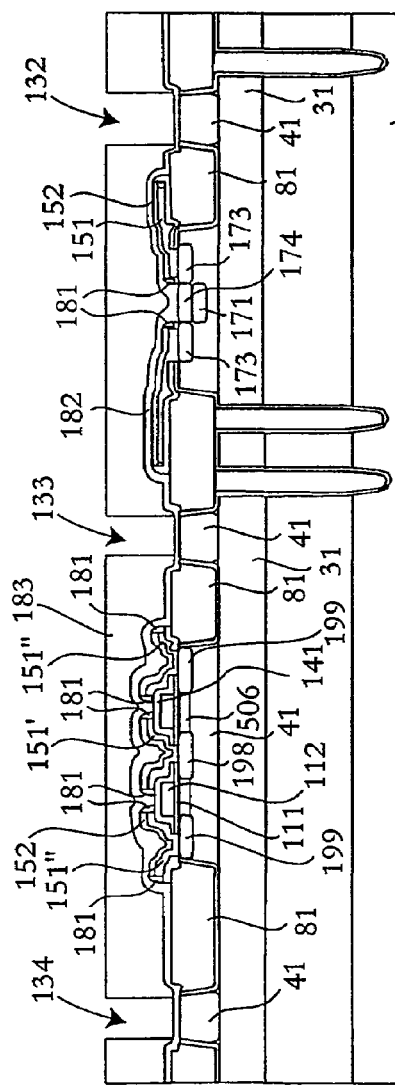

After the etching, a polysilicon layer 182 is deposited, and subsequently n-type doped. A further mask layer 183, which defines areas for substrate contact areas 132, 133, 134, is patterned, and then further n-type dopant is implanted. The resulting structure is shown in FIG. 6. The resist mask 183 is thereafter removed.

Figure 7:
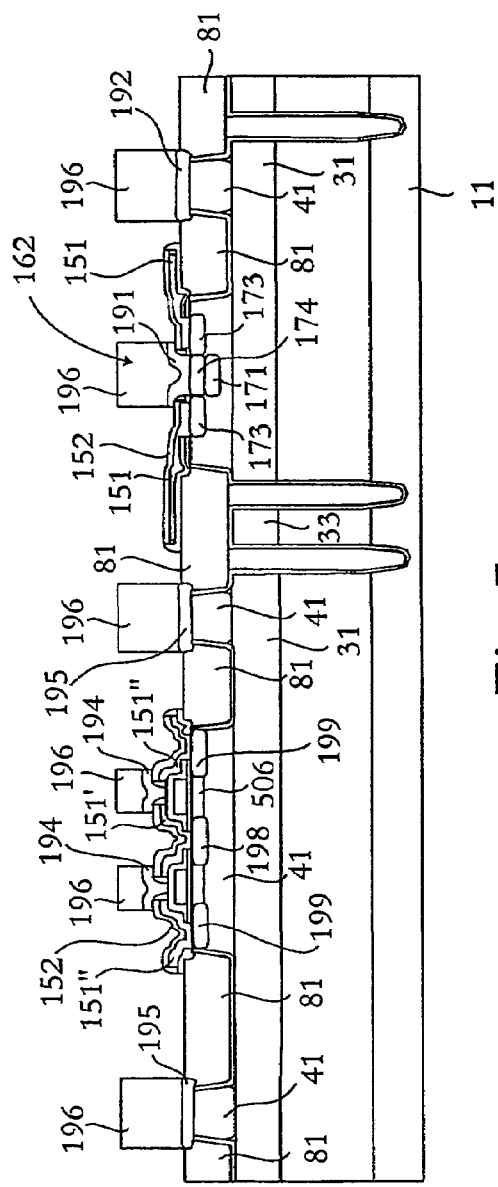

The doped polysilicon layer 182 will next be patterned using lithography and dry etching. In this step, using a photo mask 196 a polycrystalline gate contact 194 and a polycrystalline substrate contact 195 for the PMOS structure/lateral PNP transistor, and polycrystalline contact areas 191, 192 to the emitter and the collector of the NPN transistor are etched. The structure obtained is illustrated in FIG. 7, and the photo mask 196 layout for the PMOS structure/lateral PNP transistor is illustrated in FIG. 14. After the etching the mask 196 is removed.

Thereafter, portions of the oxide layer 152 on the p-type polysilicon layer 151 is removed by means of applying a photo mask 197 and etching until the polysilicon is exposed in the openings of the photo mask 197. The oxide layer 152 is left at portions of the PMOS structure/lateral PNP transistor to obtain electrical isolation between the gate contact 194 and the polycrystalline source and drain regions 151', 151".

Figure 8:
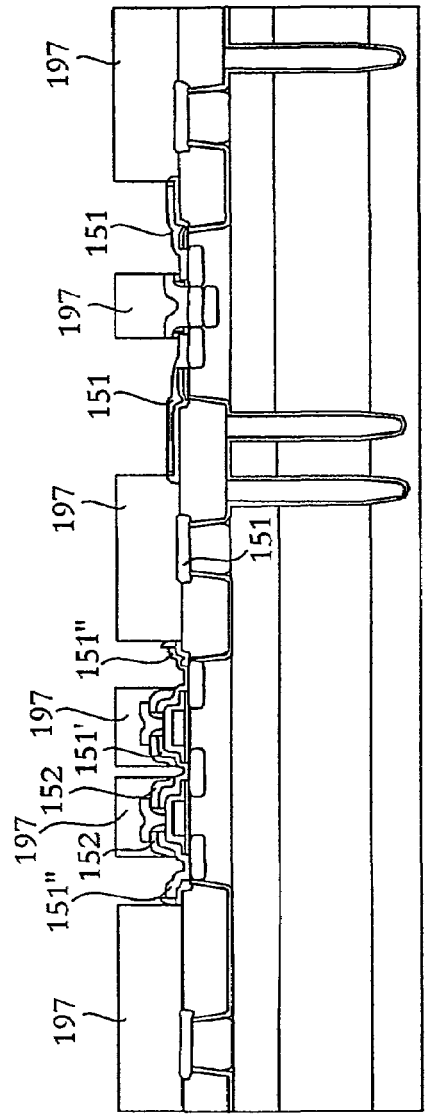
Figure 15:
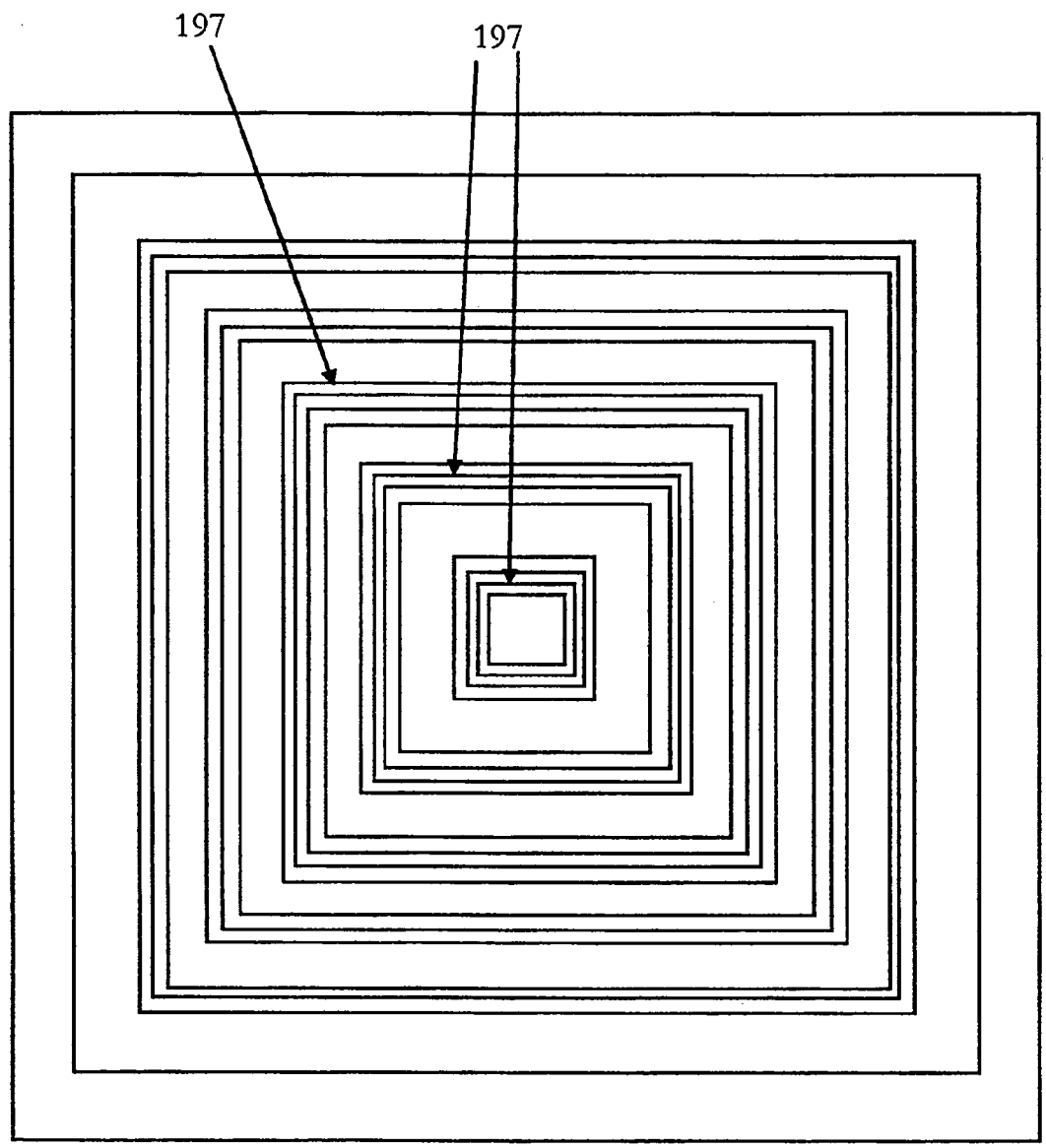

Subsequent to etching, a p-type dopant implant is performed to additionally dope the drain, source, and base contacts for the transistors. A resultant structure is shown in FIG. 8, and the photo mask 197 layout for the PMOS structure/lateral PNP transistor is shown in FIG. 15. After completed etching and implantation the photo mask 197 is removed.

Next, an oxide-nitride bi-layer is formed on the structure, whereafter the wafer is exposed to high temperature to activate and drive-in the previously implanted dopants to inter alia form an n-type doped emitter region 202.

Figure 9:
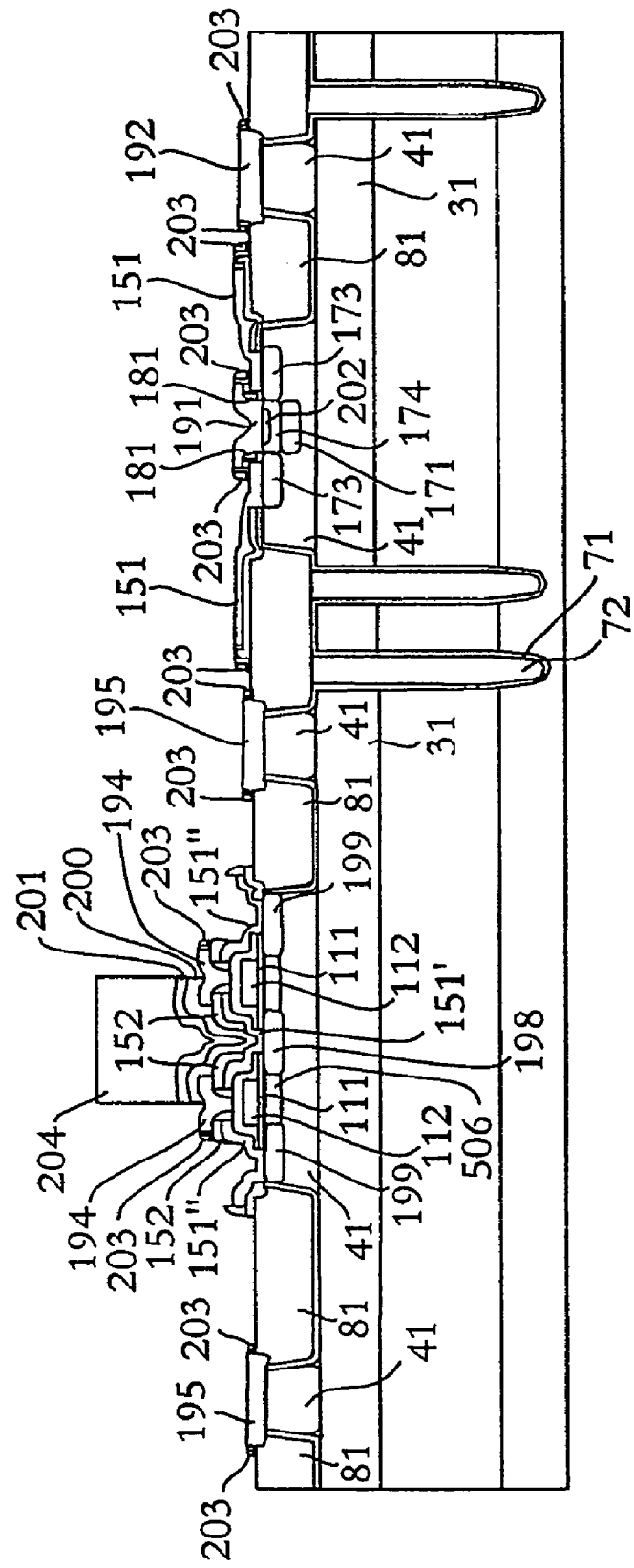
Figure 16:
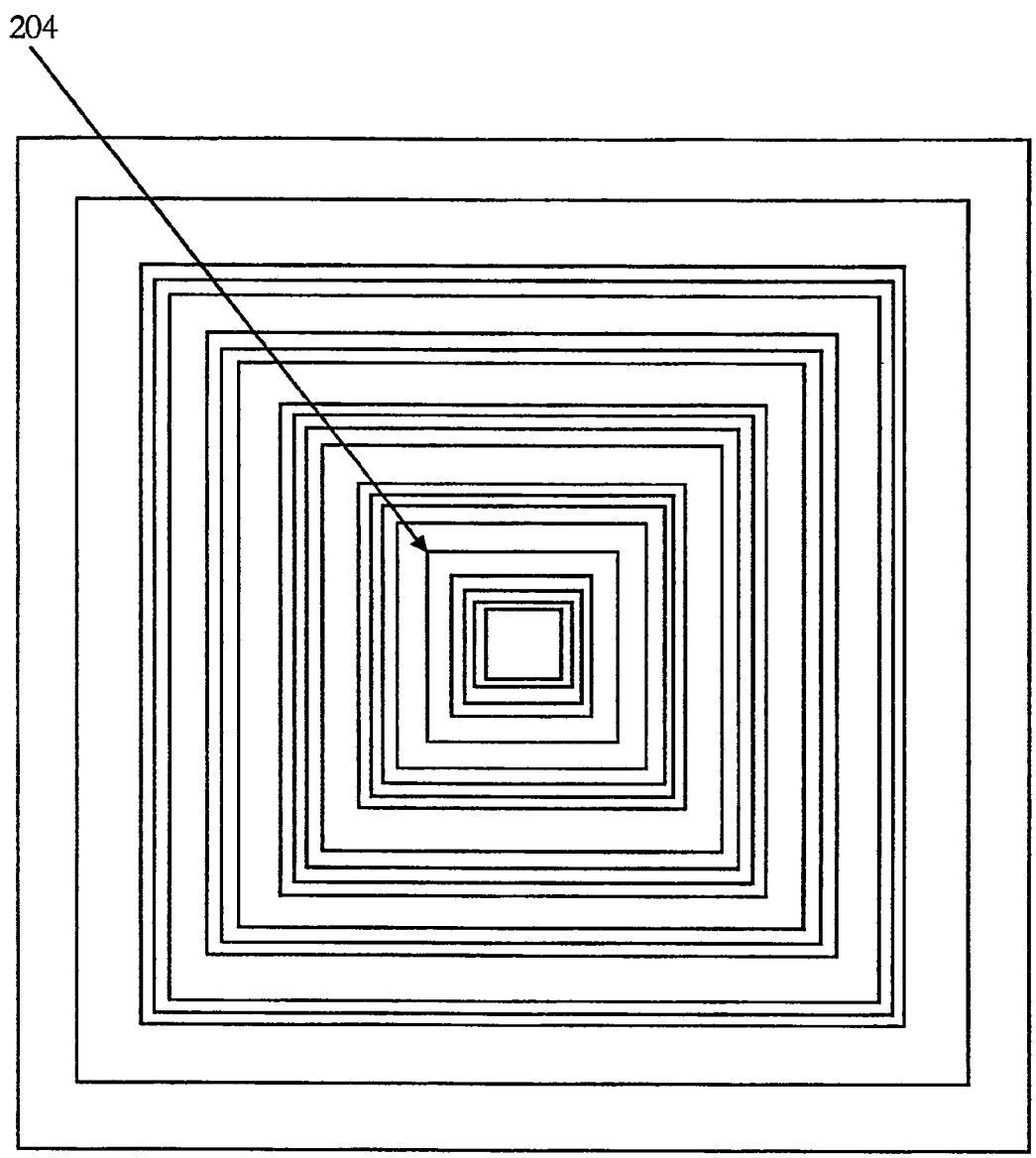

The bi-layer layer 200, 201 is subsequently etched anisotropically using a mask 204 covering the central source region of the PMOS structure/lateral PNP transistor, such that spacers 203 consisting of remaining portions 200, 201 of the oxide-nitride bi-layer are formed. The resulting structure is illustrated in FIG. 9, and the layout of the mask 204 for the PMOS structure/lateral PNP transistor is shown in FIG. 16. Subsequently the mask 204 is removed.

Thereafter, exposed silicon surfaces (i.e. collector, base, and emitter contacts 192, 151, 191 of the bipolar NPN transistor and the gate and drain contacts 194, 151" of the PMOS structure/lateral PNP transistor may be provided with silicide 205 in a self-aligned manner (SALICIDE) to reduce the resistance. The mask 204 prevent silicide formation on the emitter areas of the lateral PNP transistor, wherewith the recombination rate is increased and the gain (beta) is reduced.

Figure 10:
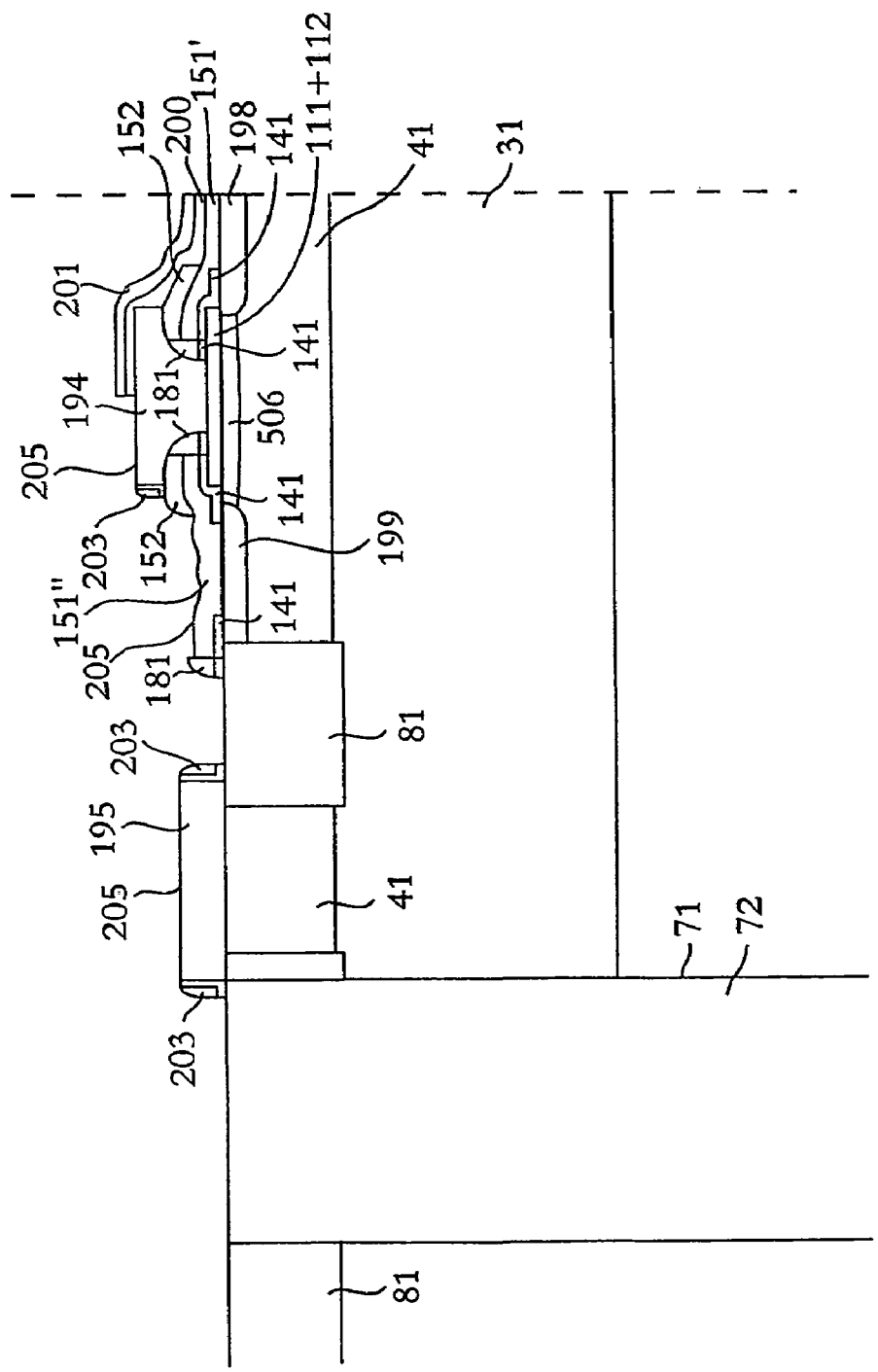
FIG. 10 is a highly enlarged cross-sectional view of a portion of a lateral PNP transistor according to a preferred embodiment of the present invention.

A portion of the resultant structure, namely the left-hand side of the PMOS structure/lateral PNP transistor, is shown in a highly enlarged cross-sectional view in FIG. 10. Note that the PMOS structure/lateral PNP transistor is completely symmetric with respect to the symmetry axis indicated in the Figure.

It shall be appreciated that in an alternative embodiment, the drain region 199, the gate region 194, the diffused n$^+$-type doped contact 41, 195, and optionally the emitter contact 191 of the NPN transistor can be protected by the same mask (not illustrated in FIG. 9) to further prevent silicide formation on these areas if desired.

Figure 17:
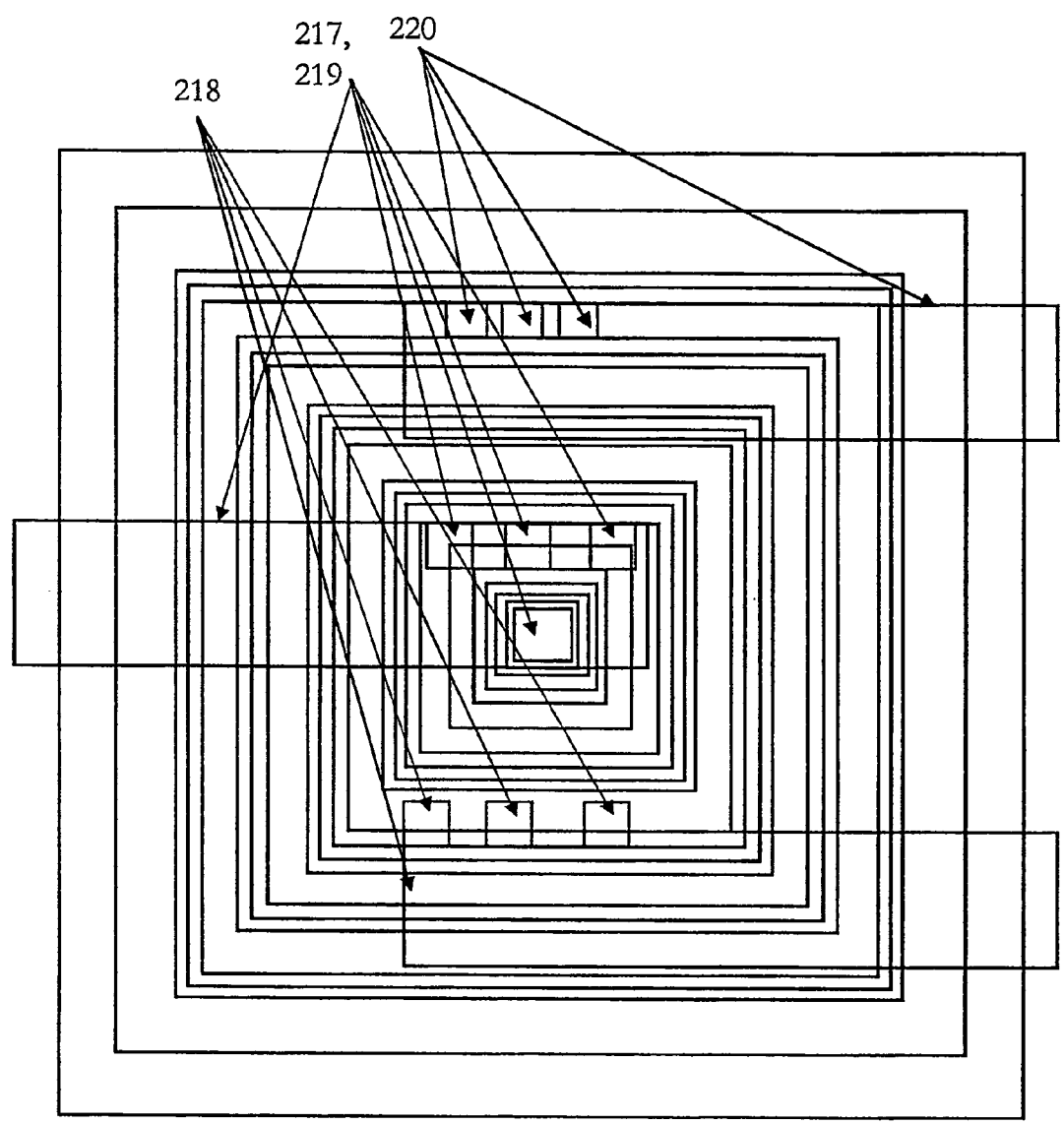

The process then continues with formation of passivation and metal layers. In FIG. 17 is shown the mask layout for contact holes to the active regions and metallization 217, 218, 219, 220 for the PMOS structure/lateral PNP transistor.

According to the present invention the PMOS-based structure is connected to resemble the principal operation of a PNP transistor.

Thus, the source region 198 is connected to the gate region 194 via metallization 217, 219 and constitutes an emitter of the PNP transistor; the drain region 199 is connected via metallization 218 and constitutes a collector of the PNP transistor; and the diffused n$^+$-type doped contact 41, 195 is connected via metallization 228 and constitutes a base contact of the PNP transistor.

In FIGS. 11–17 circular gate 194, drain 199 and diffused n$^+$-type doped contact 195 regions are formed, while the source region 198 is formed centrally. It shall, however, be appreciated that the lateral shape of the lateral PNP transistor may be completely different.

Note for instance that the cross-sectional views of FIGS. 1–10 deviate from the mask layouts of FIGS. 11–17 in that the cross-sectional views illustrate a structure where no deep trench exist on the left-hand side of the PMOS/PNP transistor and further the left-hand portion of the STI 81, which isolates the drain region 199 from the collector plug 41 of the PMOS/PNP transistor, is wider than the right-hand portion thereof.

It will be obvious that the invention may be varied in a plurality of ways. Such variations are not to be regarded as a departure from the scope of the invention. All such modifications as would be obvious to one skilled in the art are intended to be included within the scope of the appended claims.

We claim:

1. A method in the fabrication of an integrated bipolar circuit, particularly an integrated circuit for radio frequency applications, including a lateral PNP transistor, comprising the steps of:

providing a p-type doped substrate having an upper surface;

forming in said substrate a buried n$^+$-type doped region for a PMOS transistor structure;

forming in said substrate an n-type doped region above the buried n$^+$-type doped region;

forming field isolation areas around, in a horizontal plane, said n-type doped region;

forming a PMOS gate region on said n-type doped region;

forming a diffused n$^+$-type doped contact from the upper surface of the substrate to the buried n$^+$-type doped region; said contact being separated from, in a horizontal plane, said n-type doped region;

forming a p-type doped polysilicon source region on said n-type doped region;

forming a p-type doped source region in said n-type doped region by means of diffusion from said p-type doped polysilicon source region;

forming a p-type doped drain region in said n-type doped region; and connecting the PMOS transistor structure to operate as a PNP transistor, wherein the source region is connected to the gate region and constitutes an emitter of the PNP transistor; the drain region constitutes a collector of the PNP transistor; and the n-type doped region constitutes a base of the PNP transistor.

2. The method as claimed in claim 1, wherein a p-type doped polysilicon drain region on said n-type doped region;

and said p-type doped drain region in said n-type doped region is formed by means of diffusion from said p-type doped polysilicon drain region.

3. The method as claimed in claim 1, wherein said field isolation areas are formed as shallow trenches filled with oxide and such that they extend vertically from the upper surface of said substrate and down into the buried $n^+$-type doped region.

4. The method as claimed in claim 3, wherein said field isolation areas are formed with respect to the buried $n^+$-type doped region such that the buried $n^+$-type doped region extends into areas located underneath the field isolation areas.

5. The method as claimed in claim 1, wherein a deep trench is formed around, in a horizontal plane, said buried $n^+$-type doped region, said deep trench extending deeper down into the substrate than said buried $n^+$-type doped region.

6. The method as claimed in claim 1, wherein a buried p-type doped channel is formed in said region by means of ion implantation such that said buried p-type doped channel has a maximum dopant concentration at a distance from the upper surface of said semiconductor substrate, said buried p-type doped channel interconnecting said source and drain regions.

7. The method as claimed in claim 1, wherein
said PMOS gate region is formed as an $n^+$-type doped silicon layer on top of an oxide layer; and
said PMOS gate region is provided with a sidewall spacer, which surrounds, in a horizontal plane, said $n^+$-type doped silicon layer and said oxide layer.

8. The method as claimed in claim 1, wherein said gate region is formed to surround, in a horizontal plane, said source region.

9. The method as claimed in claim 8, wherein said drain region is formed to surround, in a horizontal plane, said gate region.

10. The method as claimed in claim 9, wherein said diffused $n^+$-type doped contact is formed to surround, in a horizontal plane, said drain region.

11. The method as claimed in claim 1, wherein said drain region, said gate region and said diffused $n^+$-type doped contact, all of which being made of doped silicon, are silicided, while said source region, being made of doped silicon, is masked and is thus prevented from being silicided.

12. The method as claimed in claim 1, wherein said source region, said drain region, said gate region and said diffused $n^+$-type doped contact, all of which being made of doped silicon, are each directly connected to a respective metal contact without being silicided.

13. The method as claimed in claim 1, wherein
a buried $n^+$-type doped region for an NPN transistor is formed in said substrate simultaneously with the formation of the buried $n^+$-type doped region for the PMOS transistor structure;
an n-type doped region is formed above the buried $n^+$-type doped region for the NPN transistor simultaneously with the formation of the n-type doped region above the buried $n^+$-type doped region for the PMOS transistor structure;
field isolation areas are formed around, in a horizontal plane, the n-type doped region above the buried $n^+$-type doped region for the NPN transistor simultaneously with the formation of the field isolation areas around the n-type doped region above the buried $n^+$-type doped region for the PMOS transistor structure;
a p-type doped base is formed in the n-type doped region above the buried $n^+$-type doped region for the NPN transistor and an n-type doped emitter is formed in the p-type doped base; and
an n-type doped collector contact is formed to the buried $n^+$-type doped region for the NPN transistor simultaneously with the formation of the diffused $n^+$-type doped contact to the buried $n^+$-type doped region for the PMOS transistor structure, said n-type doped collector contact being separated from, in a horizontal plane, said n-type doped regions.

14. The method as claimed in claim 13, wherein an extrinsic base contact connected to the p-type doped base is formed simultaneously with the formation of said p-type doped polysilicon source region.

* * * * *